(12) United States Patent
Ju

(10) Patent No.: US 9,668,357 B2
(45) Date of Patent: May 30, 2017

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 142 days.

(21) Appl. No.: 14/630,777

(22) Filed: Feb. 25, 2015

(65) Prior Publication Data

US 2015/0245489 A1 Aug. 27, 2015

(30) Foreign Application Priority Data

Feb. 27, 2014 (CN) .................... 2014 2 0085568 U

(51) Int. Cl.
H05K 1/11 (2006.01)
H05K 1/14 (2006.01)
H05K 3/34 (2006.01)

(52) U.S. Cl.
CPC ... *H05K 3/3436* (2013.01); *H05K 2201/0133* (2013.01); *H05K 2201/10378* (2013.01); *H05K 2201/10734* (2013.01); *H05K 2203/041* (2013.01); *Y02P 70/613* (2015.11)

(58) Field of Classification Search
CPC H01R 12/57; H01R 12/7082; H01R 13/2421; H05K 1/11; H05K 1/14; H05K 1/111; H05K 1/141; H05K 2924/01078–2924/01079

USPC ...................... 361/767–777; 439/65–66, 179
See application file for complete search history.

(56) References Cited

U.S. PATENT DOCUMENTS

| 6,800,169 | B2 * | 10/2004 | Liu | B32B 7/12 156/292 |
| 7,442,045 | B1 * | 10/2008 | Di Stefano | H01R 4/027 439/439 |
| 7,731,513 | B1 * | 6/2010 | Lin | H01R 13/2421 439/179 |
| 2007/0128906 | A1 * | 6/2007 | Kazama | G01R 1/06722 439/179 |

* cited by examiner

Primary Examiner — Tuan T Dinh
(74) Attorney, Agent, or Firm — Locke Lord LLP; Tim Tingkang Xia, Esq.

(57) ABSTRACT

An electrical connector for electrically connecting a chip module and a circuit board, includes an insulation body having multiple receiving holes. A first conductor is disposed in each of the receiving holes. The chip module has multiple first conducting portions corresponding to the receiving holes. The circuit board has multiple second conducting portions corresponding to the receiving holes. The first conductor electrically conducts the first conducting portion and the second conducting portion. The first conductor is in a sphere shape, and gallium or gallium alloy is disposed on a surface of the first conductor, or the first conductor is made of a gallium or gallium alloy material.

16 Claims, 9 Drawing Sheets

ELECTRICAL CONNECTOR

CROSS-REFERENCE TO RELATED APPLICATION

This non-provisional application claims priority under 35 U.S.C. §119(a) on Patent Application No. 201420085568.3 filed in P.R. China on Feb. 27, 2014, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector for electrically connecting a chip module and a circuit board.

BACKGROUND OF THE INVENTION

Currently, an electrical connector generally includes an insulation body and at least one conductor accommodated in the insulation body. This conductor is generally formed by punching a metal sheet material, but this metal sheet material is high in impedance. Particularly, when the conductor and a mating electronic element are in mechanical contact, high impedance generally occurs at the location of the contact. Additionally, under many situations, in order to ensure good elasticity of the conductor, the conductor needs to be bent. In this way, the length of the conductor increases, and therefore the impedance of the conductor also increases.

Therefore, a heretofore unaddressed need exists in the art to address the aforementioned deficiencies and inadequacies.

SUMMARY OF THE INVENTION

In one aspect, the present invention is directed to an electrical connector with small impedance, and can improve stability of electrical connection and signal transmission between a chip module and the electrical connector.

In one embodiment, an electrical connector used for electrically connecting a first electronic element and a second electronic element includes an insulation body. The insulation body has multiple receiving holes. A first conductor is disposed in each of the receiving holes. The first electronic element is provided with multiple first conducting portions corresponding to the receiving holes, and the second electronic element is provided with multiple second conducting portions corresponding to the receiving holes. The first conductor can electrically conduct the first conducting portion and the second conducting portion. The first conductor is in a sphere shape, and gallium or gallium alloy is disposed on a surface of the first conductor, or the first conductor is made of a gallium or gallium alloy material.

In one embodiment, an electrical connector used for electrically connecting a first electronic element and a second electronic element includes an insulation body. The insulation body has multiple receiving holes. A first conductor is disposed in each of the receiving holes. The first electronic element is provided with multiple first conducting portions corresponding to the receiving holes, and the second electronic element is provided with multiple second conducting portions corresponding to the receiving holes. The first conductor electrically conducts the first conducting portion and the second conducting portion. The first conductor is in a sphere shape, gallium or gallium alloy is disposed on a surface of the first conductor, or the first conductor is made of a gallium or gallium alloy material. An elastomer is disposed between the first conductor and the first conducting portion or the second conducting portion.

In one embodiment, an electrical connector used for electrically connecting a chip module and a circuit board includes an insulation body. The insulating body has multiple receiving holes. A first conductor is disposed in each of the receiving holes. The chip module has multiple first conducting portions corresponding to the receiving holes, and the circuit board has multiple second conducting portions corresponding to the receiving holes. The receiving hole includes a first accommodating cavity and a second accommodating cavity in communication with each other. The first conductor is received in the second accommodating cavity. A liquid conductor is at least partially disposed in the first accommodating cavity. The liquid conductor electrically conducts the first conductor and the first conducting portion.

Compared with the related art, in certain embodiments of the present invention, the first conductor is designed into a sphere shape, the length of the first conductor may be effectively reduced, and the impedance of the electrical connector can be reduced. Meanwhile, the surface of the first conductor is coated with gallium or gallium alloy, and formed with a conducting path, and the entire impedance of the electrical connector can be further reduced. An elastomer is disposed between the first conductor and the first conducting portion, and a transient interruption phenomenon of the electrical connector can be effectively avoided, thereby ensuring good signal transmission between electronic elements.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
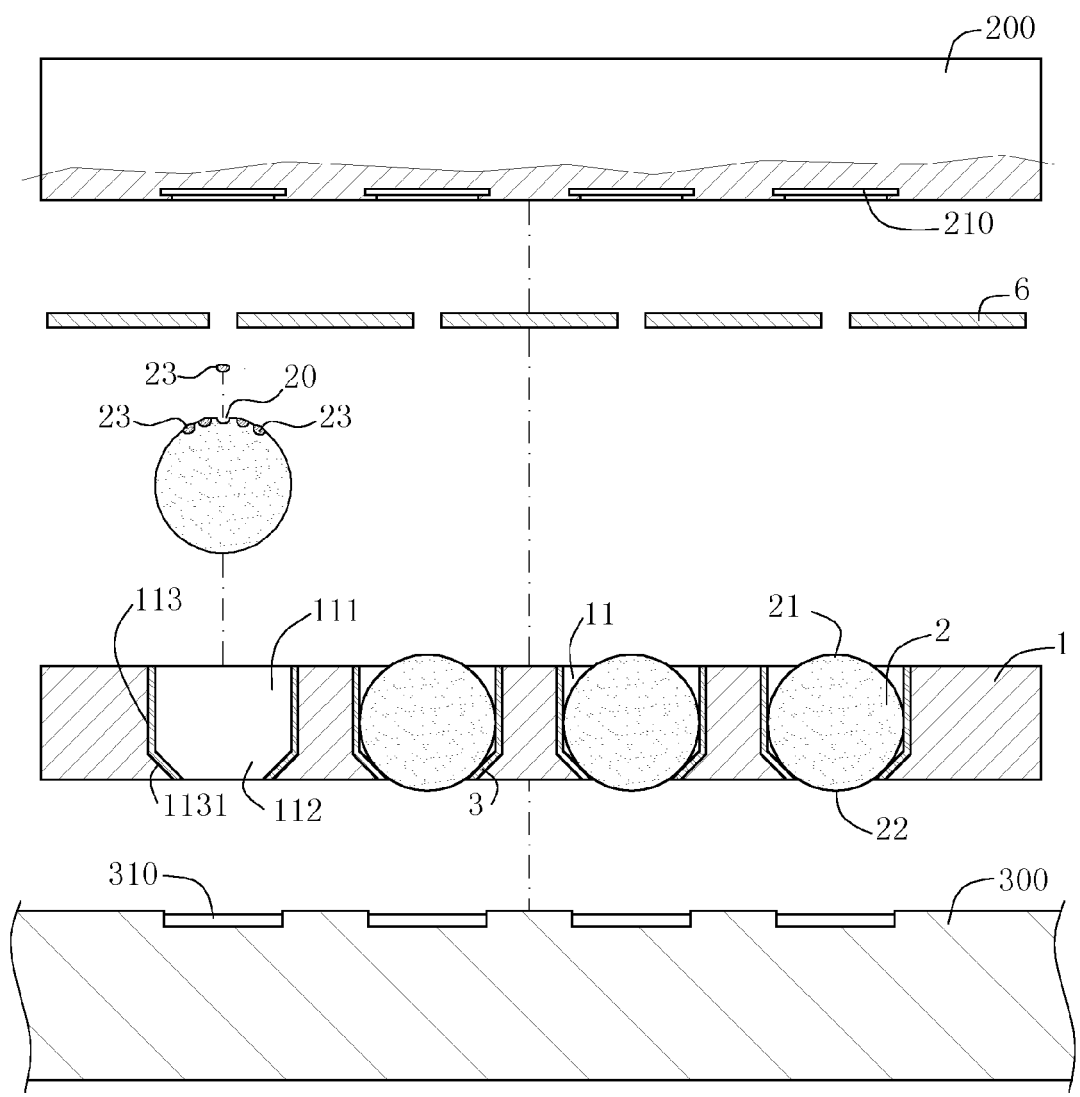
FIG. 1 is an exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 2:
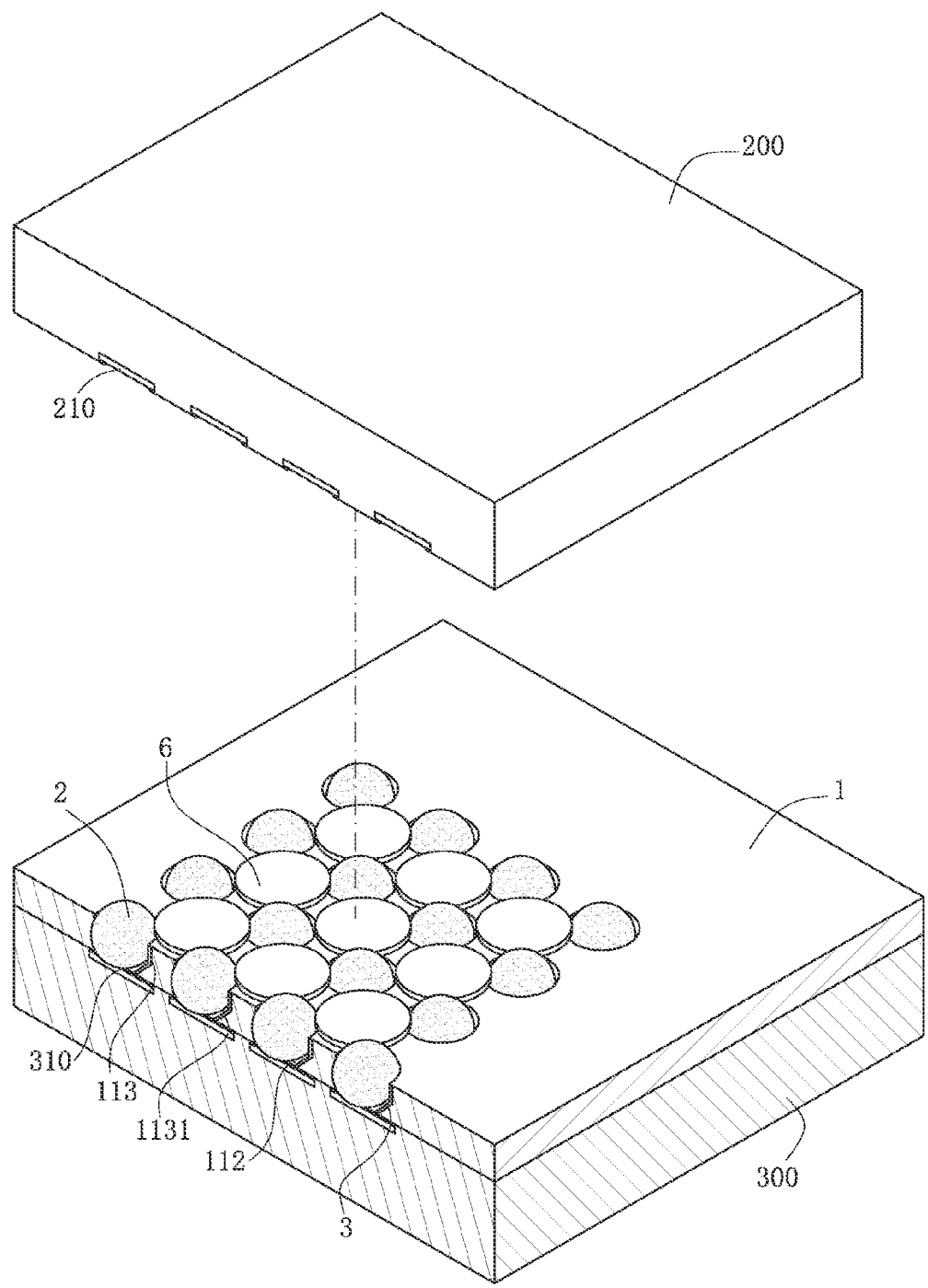
FIG. 2 is a three-dimensional exploded view of the electrical connector according to the first embodiment of the present invention.
Figure 3:
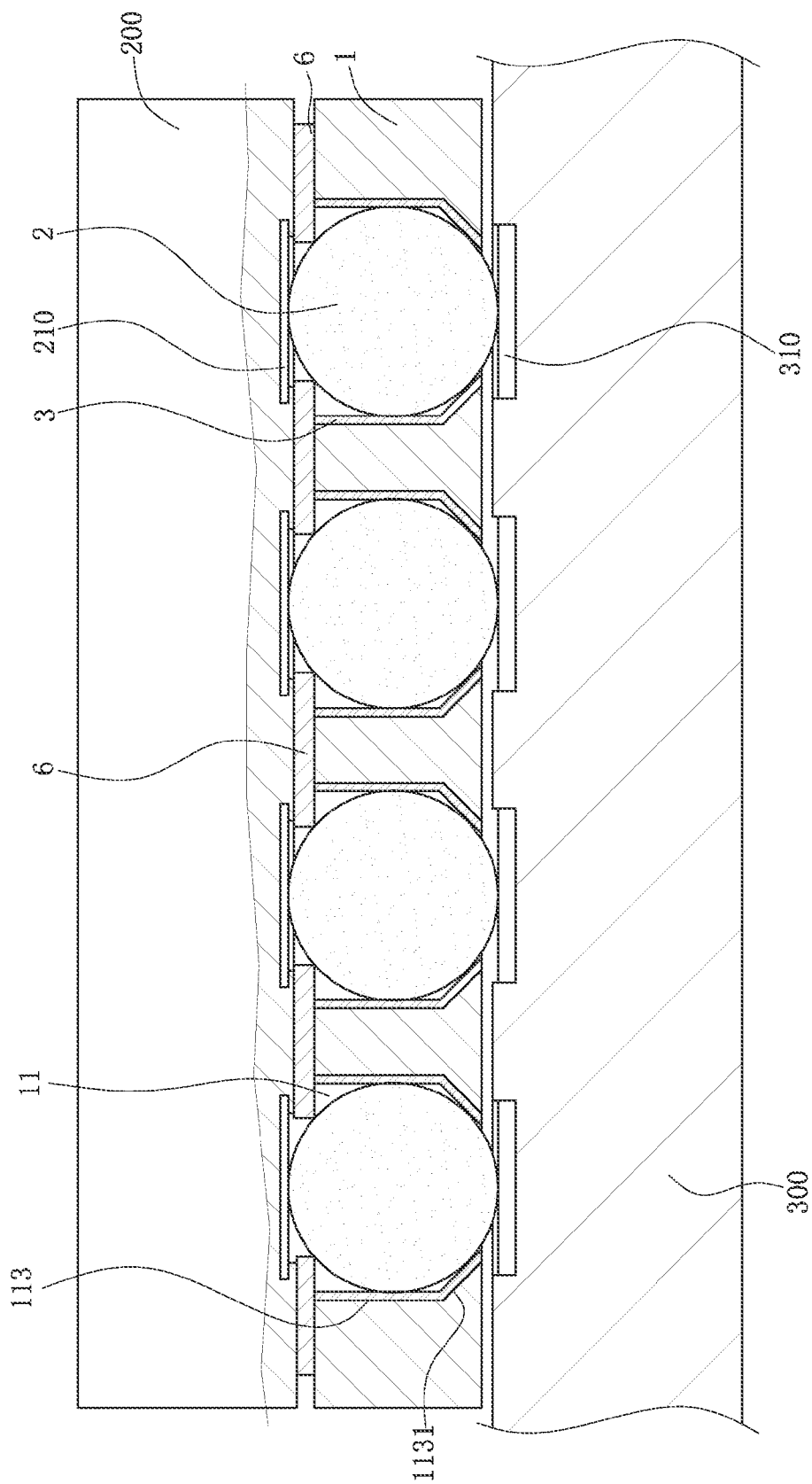
FIG. 3 is an assembly view of the electrical connector according to the first embodiment of the present invention.

As shown in FIG. 1 to FIG. 3, as a first embodiment of the present invention, an electrical connector is used for electrically connecting a first electronic element and a second electronic element. In this embodiment, the first electronic element is a chip module 200, and the second electronic element is a circuit board 300. The chip module 200 is provided with multiple first conducting portions 210, and the circuit board 300 is provided with multiple second conducting portions 310. The electrical connector includes an insulation body 1 and multiple first conductors 2. The first conductors 2 are accommodated in the insulation body 1 and electrically conduct the chip module 200 and the circuit board 300. In other embodiments, the first electronic element and the second electronic element may also be other components.

The insulation body 1 is a plate-shaped body, made of plastic which is not easily deformed. The insulation body 1 includes receiving holes 11 accommodating the first conductors 2. The receiving hole 11 runs through the insulation body 1, and is formed with a first opening 111 on an upper surface of the insulation body 1 and formed with a second opening 112 on a lower surface of the insulation body 1. The size of the second opening 112 is less than the size of the first opening 111. An inner wall 113 of the receiving hole 11 extends from the first opening 111 toward the second opening 112. An included angle is formed between an extending direction of the inner wall 113 and a perpendicular direction. The inner wall 113 is formed with a supporting portion 1131 nearby the second opening 112. The supporting portion 1131 is used for supporting the first conductor 2. The supporting portion 1131 may be an inclined surface or a cambered surface.

The first conductor 2 is a sphere-shaped body. A first contact portion 21 and a second contact portion 22 are disposed at two ends of the first conductor 2. The first contact portion 21 and the second contact portion 22 can be partially exposed from the upper surface and the lower surface of the insulation body 1 and be electrically connected to the chip module 200 and the circuit board 300. In one embodiment, the first conductor 2 may be a copper ball or tin ball, and then a surface thereof is plated with gallium or gallium alloy to further reduce impedance of the electrical connector. In one embodiment, the first conductor 2 may directly be a gallium or gallium alloy ball. When the first conductor 2 is a copper ball or tin ball externally plated with gallium or gallium alloy, in order to make the gallium or gallium alloy better be attached to the surface of the first conductor 2, multiple grooves 20 may be disposed on the surface of the first conductor 2 to receive the gallium or gallium alloy 23. When the first conductor 2 is a gallium-tin alloy ball, content of tin in the tin-gallium alloy ball needs to be greater than 65%. A second conductor 3 which can be electrically conducted to the first conductor 2 is disposed in the receiving hole 11. The second conductor 3 is a metal layer tightly attached to the inner wall 113. The length of the second conductor 3 is greater than the length of the first conductor 2. Gallium or gallium alloy is further disposed on a surface of the second conductor 3, where the gallium alloy is alloy of gallium and tin, and content of the tin is less than 65%. A liquid conductor 4 may be further disposed in the receiving hole 11, to further enhance electrical connection between the first conducting portion 210, the second conducting portion 310, the first conductor 2 and the second conductor 3. The liquid conductor 4 is selected from gallium or gallium alloy.

A stopper 6 is disposed on the upper surface of the insulation body 1, and covers a part of the receiving hole 11.

In this embodiment, the stopper 6 and the insulation body 1 are integrally formed, and a space between two adjacent stoppers 6 is smaller than the inner diameter of the receiving hole 11. In other embodiments, the stopper 6 and the insulation body 1 may also be separately formed and then fixed together, for example, the stopper 6 is a plastic layer (not shown), the plastic layer is provided with holes corresponding to the receiving holes 11, and the plastic layer can partially enter the receiving holes 11, to stop the first conductors 2.

When the chip module 200 and the circuit board 300 are assembled together using the electrical connector, a conducting path from the first conducting portion 210 to the first conductor 2, and then to the second conducting portion 310 is formed, thereby implementing electrical connection between the chip module 200 and the circuit board 300.

Figure 4:
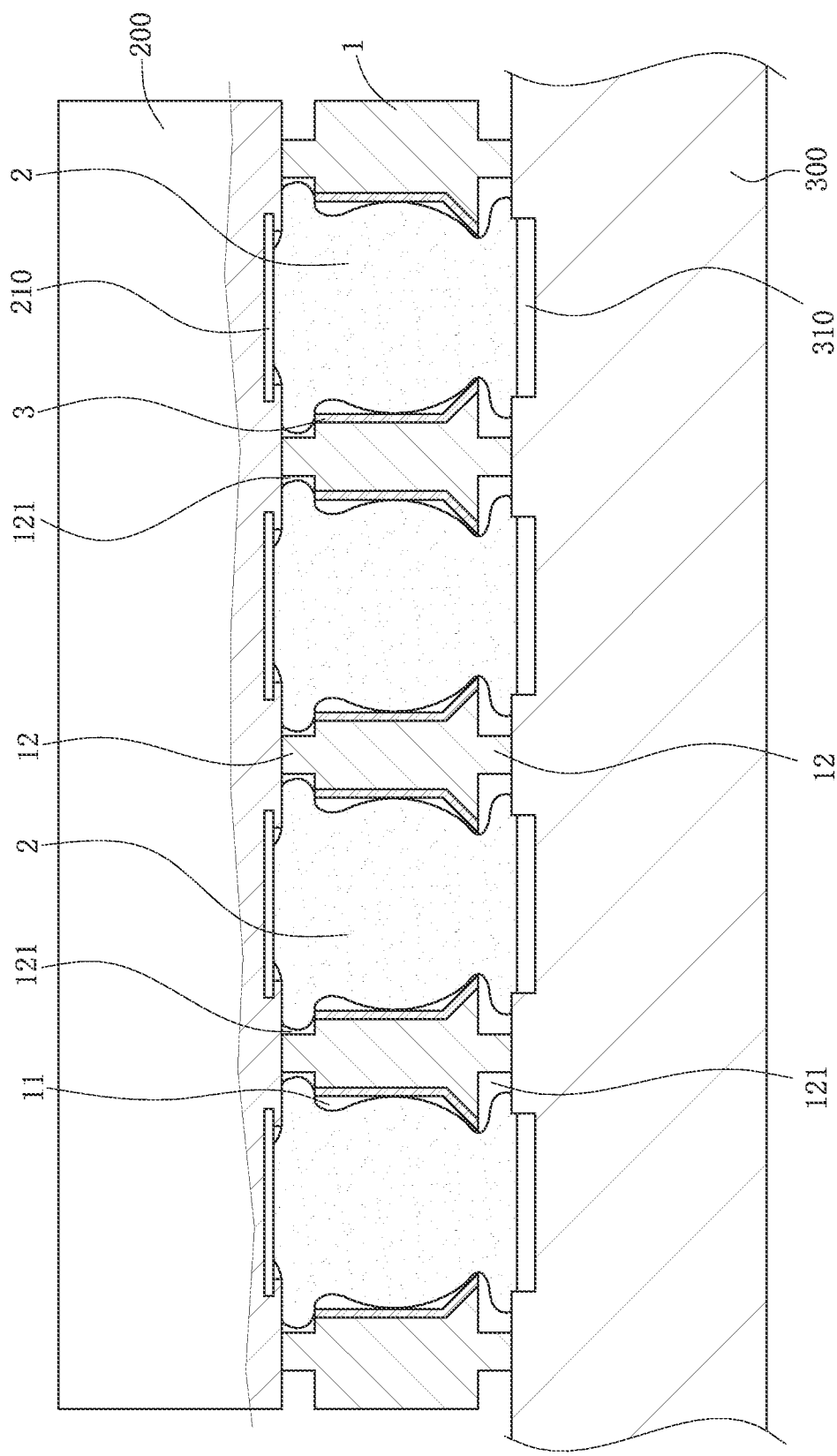
FIG. 4 is an assembly view of an electrical connector according to a second embodiment of the present invention.

As shown in FIG. 4, as a second embodiment of the present invention, differences between an electrical connector of the second embodiment and the electrical connector of the first embodiment lie in that, there are no stoppers 6 between the insulation body 1 and the chip module 200, and the insulation body 1 is provided with a protruding portion 12 completely surrounding the receiving hole 11 on the upper surface and the lower surface. In this embodiment, the protruding portion 12 is in a circular ring shape, the radius of which is greater than the radius of the receiving hole 11. In other embodiments, the protruding portion 12 may be in a rectangular shape or another irregular shape. A material overflowing space 121 is formed between the protruding portion 12 and the receiving hole 11. When the gallium or gallium alloy is melted under pressing or heating or under a combined action of the pressing and heating, the melted gallium or gallium alloy can enter the material overflowing space 121, to prevent the liquid gallium or gallium alloy from leaking.

Figure 5:
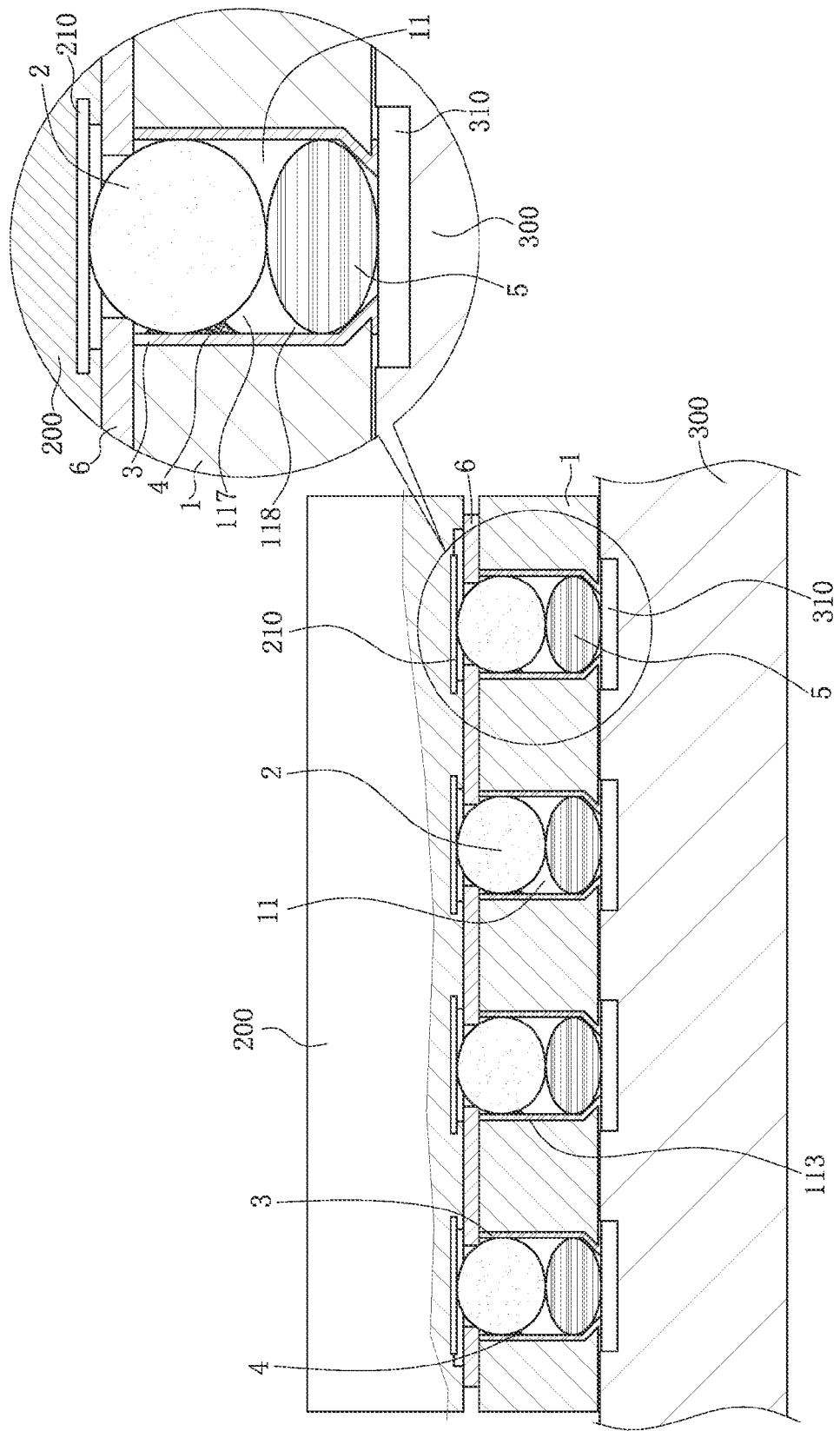
FIG. 5 is an assembly view of an electrical connector according to a third embodiment of the present invention.

As shown in FIG. 5, as a third embodiment of the present invention, an electrical connector is used for electrically connecting a chip module 200 to a circuit board 300. The chip module 200 includes multiple first conducting portions 210, and the circuit board 300 includes multiple second conducting portions 310. The electrical connector includes an insulation body 1. The insulation body 1 is provided with multiple receiving holes 11 corresponding to the chip module 200 and the circuit board 300, and a first conductor 2 is accommodated in the receiving hole 11.

The electrical connector further includes an elastomer 5. The elastomer 5 is a sphere-shaped body or bulk-shaped body that is made of a foaming material. Gallium or gallium alloy is disposed on the elastomer 5. The elastomer 5 is disposed in the receiving hole 11. In this embodiment, the elastomer 5 is disposed between the first conductor 2 and the second conducting portion 310, and elastically urges the first conductor 2. The elastomer 5 divides the receiving hole 11 into a first receiving space 117 and a second receiving space 118. The first conductor 2 is accommodated in the first receiving space 117, and the elastomer 5 is accommodated in the second receiving space 118. In other embodiments, the elastomer 5 may further be disposed between the first conductor 2 and the first conducting portion 210.

An inner wall 113 of the receiving hole 11 has a slope, to bear the elastomer 5, and prevent it from falling off. A second conductor 3 is further disposed in the receiving hole 11, and the second conductor 3 can be electrically conducted to the first conductor 2. In this embodiment, the second conductor 3 is a metal layer tightly attached to the inner wall 113. The length of which is greater than the length of the first conductor 2, and gallium or gallium alloy may be disposed on a surface of the second conductor 3. A liquid conductor 4 may be further disposed in the receiving hole 11, to further enhance electrical connection between the first conducting portion 210, the second conducting portion 310, the first conductor 2, the second conductor 3 and the elastomer 5, and the liquid conductor 4 is selected from gallium or gallium alloy.

A stopper 6 is disposed on the upper surface of the insulation body 1, and covers a part of the receiving hole 11. In this embodiment, the stopper 6 and the insulation body 1 are integrally formed, and a space between two adjacent stoppers 6 is smaller than the inner diameter of the receiving hole 11. In other embodiments, the stopper 6 and the insulation body 1 may also be separately formed and then fixed together, for example, the stopper 6 is a plastic layer (not shown), the plastic layer is provided with holes corresponding to the receiving holes 11, and the plastic layer can partially enter the receiving holes 11, to stop the first conductors 2.

When the chip module 200 and the circuit board 300 are assembled together using the electrical connector, a conducting path from the first conducting portion 210 to the first conductor 2, then to the elastomer 5, and then to the second conducting portion 310 is formed, thereby implementing electrical connection between the chip module 200 and the circuit board 300.

In other embodiments, the elastomer 5 may only be an insulating elastic block, on which no gallium or gallium alloy is disposed, and the elastomer 5 is disposed between the first conductor 2 and the first conducting portion 210 or between the first conductor 2 and the second conducting portion 310. The first conducting portion 210 and the second conducting portion 310 are electrically connected by using a large quantity of liquid conductor 4 in the receiving hole 11 and the first conductor 2 located in the liquid conductor 4.

Figure 6:
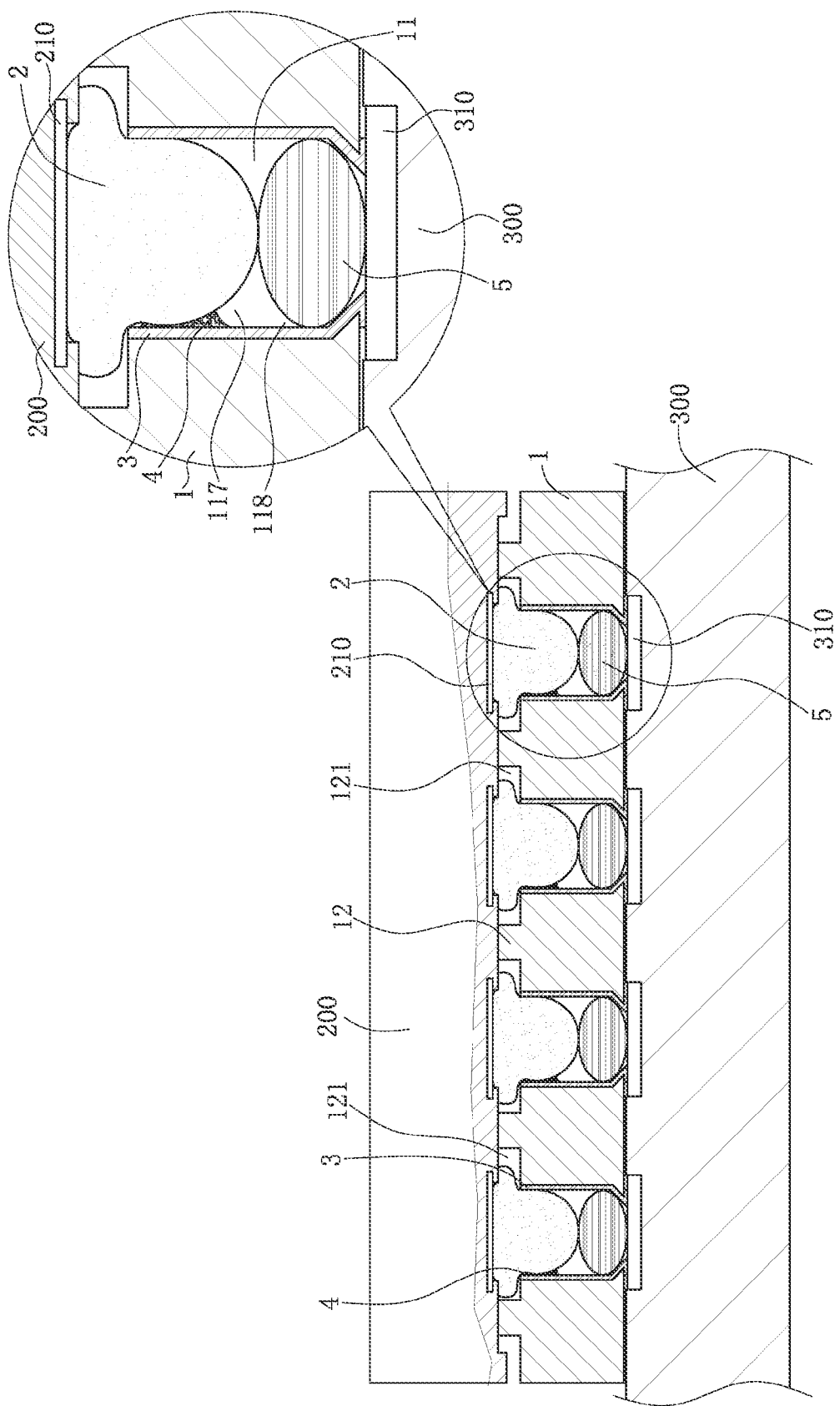
FIG. 6 is an assembly view of an electrical connector according to a fourth embodiment of the present invention.

As shown in FIG. 6, as a fourth embodiment of the present invention, differences between an electrical connector of the fourth embodiment and the electrical connector of the third embodiment lie in that, there are no stoppers 6 between the insulation body 1 and the chip module 200. But, the first conductor 2 protrudes from an upper surface of the insulation body 1, and a protruding portion 12 is disposed completely surrounding the receiving hole 11. In this embodiment, the protruding portion 12 is in a circular ring shape, the radius of which is greater than the radius of the receiving hole. In other embodiments, the protruding portion 12 may be in a rectangular shaped or another irregular shape. A material overflowing space 121 is formed between the protruding portion 12 and the receiving hole 11. When the gallium or gallium alloy is melted under pressing or heating or under a combined action of the pressing and heating, the melted gallium or gallium alloy can enter the material overflowing space 121, to prevent the liquid gallium or gallium alloy from leaking.

Figure 7:
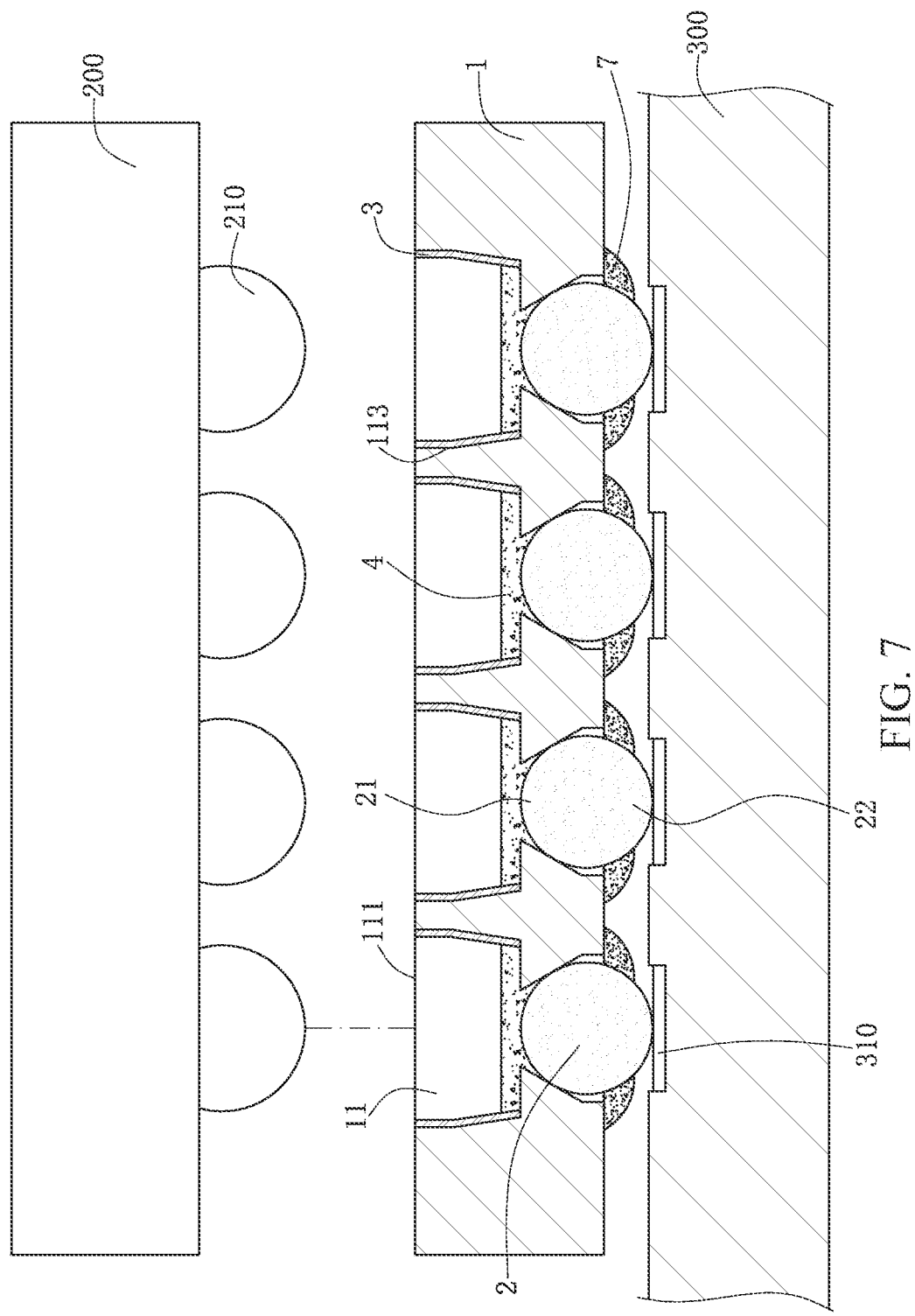
FIG. 7 is an exploded view of an electrical connector according to a fifth embodiment of the present invention.
Figure 8:
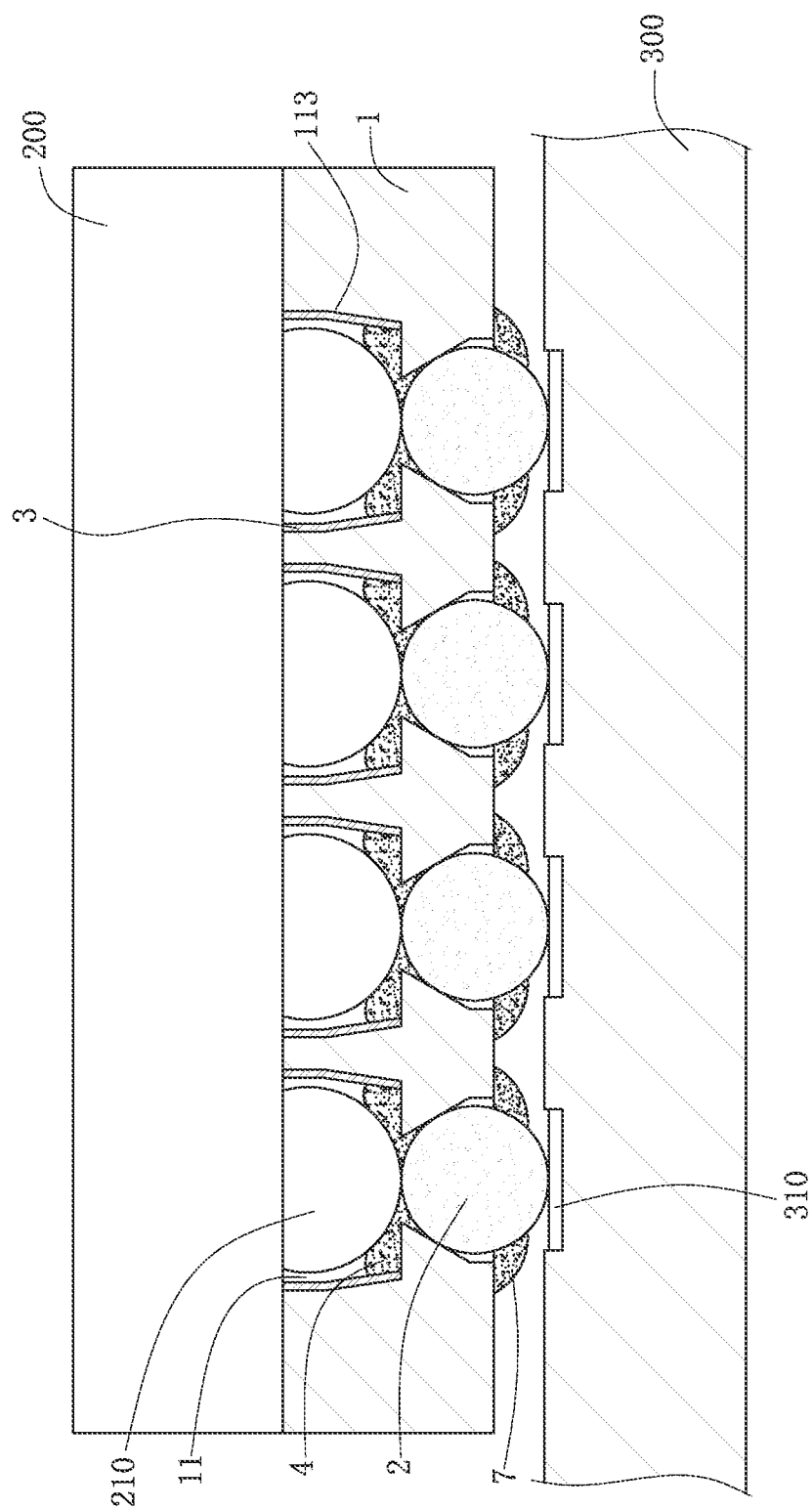
FIG. 8 is an assembly view of the electrical connector according to the fifth embodiment of the present invention.
Figure 9:
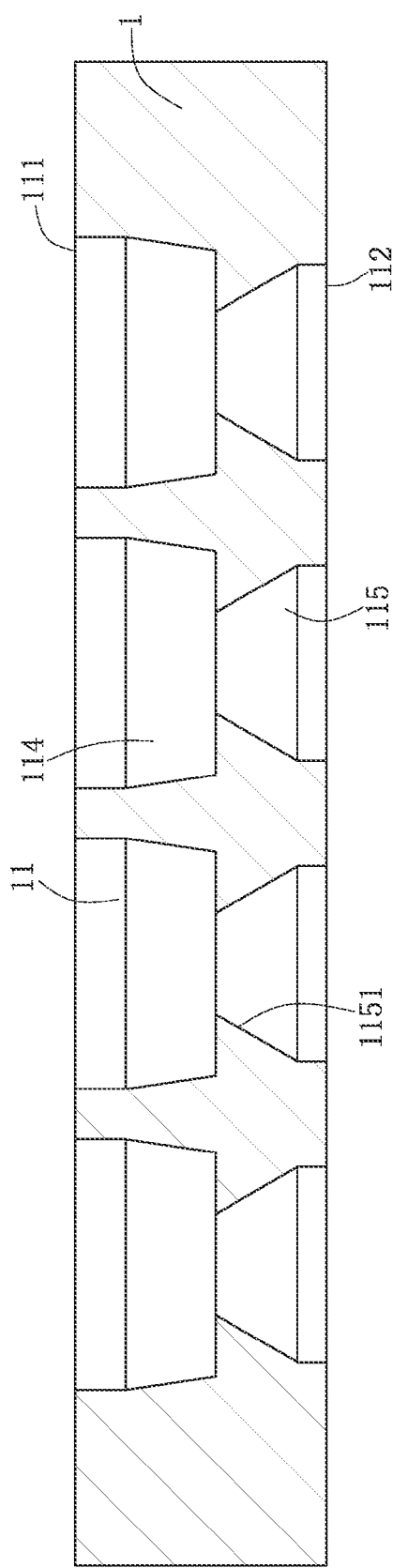
FIG. 9 is a sectional view of an insulation body in FIG. 7.

As shown in FIG. 7 to FIG. 9, as a fifth embodiment of the present invention, an electrical connector is in a ball grid array (BGA) mode, and is used for electrically connecting a chip module 200 and a circuit board 300. The chip module 200 includes multiple first conducting portions 210. The first conducting portion 210 is a tin ball. The circuit board 300 includes multiple second conducting portions 310. The electrical connector includes an insulation body 1, multiple first conductors 2 and multiple liquid conductors 4. The first conductors 2 and the liquid conductors 4 are accommodated in the insulation body 1.

The insulation body 1 is a plate-shaped body that is made of plastic not easily deformed. The insulation body 1 is provided with receiving holes 11 accommodating the first conductors 2 and the liquid conductors 4. The receiving hole 11 runs through the insulation body 1, and is formed with a first opening 111 on an upper surface of the insulation body 1 and formed with a second opening 112 on a lower surface of the insulation body 1. The receiving hole 11 includes a first accommodating cavity 114 and a second accommodating cavity 115 in communication with each other. The second accommodating cavity 115 gradually widens from upper to down, and is formed with an urging portion 1151 disposed at an inner wall of the second accommodating cavity 115. The urging portion 1151 may be an inclined surface or a cambered surface. The first conductor 2 is a sphere-shaped body, accommodated in the second accommodating cavity 115, and the urging portion 1151 can urge against the first conductor 2. The liquid conductor 4 is accommodated in the first accommodating cavity 114, and the liquid conductor 4 is selected from gallium or gallium alloy. An impermeable layer (not shown) is disposed around an opening of the first accommodating cavity 114, to prevent the liquid conductor 4 from flowing out of the receiving hole 11.

During assembly of the electrical connector, first the electrical connector is turned over by 180°, and the first conductor 2 is mounted to the second accommodating cavity 115. The first conductor 2 urges against the urging portion 1151. The lower end of the first conductor 2 is partially exposed from the insulation body 1, to form a second contact portion 22. The second contact portion 22 can be electrically connected to the second conducting portion 310. In order to hold the first conductor 2 to the insulation body 1, an adhesive 7 may be located below the second accommodating cavity 115 to prevent the first conductor 2 from rolling out from the insulation body 1, and the adhesive 7 is not lower than the first conductor 2. Then the electrical connector is reverted by 180°, and the liquid conductor 4 is filled in the first accommodating cavity 114. Finally, the chip module 200, the circuit board 300 and the electrical connector are assembled together, to form a conducting path from the first conducting portion 210 to the liquid conductor 4 then to the first conductor 2 and then to the second conducting portion 310, thereby implementing electrical connection between the chip module 200 and the circuit board 300.

In summary, the electrical connector according to certain embodiments of the present invention, among other things, has the following advantages.

(1) The first conductor 2 is designed into a sphere shape, the length of the first conductor 2 can be effectively reduced, and the height of the electrical connector can be reduced, which conforms to the development trend of thinness of the electrical connector, and meanwhile can further reduce the impedance of the electrical connector.

(2) The surface of the first conductor 2 is coated with gallium or gallium alloy, and formed with a conducting path, and the entire impedance of the electrical connector can be further reduced.

(3) An elastomer 4 is disposed between the first conductor 2 and the first conducting portion 210, the transient interruption phenomenon of the electrical connector can be effectively avoided, thereby ensuring good signal transmission between the chip module 200 and the circuit board 300.

(4) When the first conductor 2 is melted, the first conductor 2 can enter the material overflowing space 121 formed between the protruding portion 12 and the receiving hole 11, to prevent the first conductor 2 in the molten state from leaking.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a first electronic element and a second electronic element, comprising:
    an insulation body having a plurality of receiving holes, wherein a first conductor is disposed in each of the receiving holes, the first electronic element is provided with a plurality of first conducting portions corresponding to the receiving holes, the second electronic element is provided with a plurality of second conducting portions corresponding to the receiving holes, and each of the first conductors correspondingly electrically conducts one of the first conducting portions and one of the second conducting portions;
    wherein gallium or gallium alloy is disposed on a surface of the first conductor, or the first conductor is made of a gallium or gallium alloy material; and
    wherein a stopper is disposed on a surface of the insulation body, and covers a part of the receiving hole to stop the first conductor.

2. The electrical connector according to claim 1, wherein the first conductor is in a sphere shape.

3. The electrical connector according to claim 1, wherein the stopper is a plastic layer, and the plastic layer is provided with holes corresponding to the receiving holes.

4. The electrical connector according to claim 1, wherein when gallium or gallium alloy is disposed on the surface of the first conductor, the first conductor is a copper ball, a tin ball or a tin-gallium alloy ball.

5. The electrical connector according to claim 1, wherein at least one groove is depressed from a surface of the first conductor for partially accommodating gallium or gallium alloy.

6. The electrical connector according to claim 1, further comprising a second conductor disposed in the receiving hole, wherein the second conductor electrically conducts the first conductor, and the length of the second conductor is greater than the length of the first conductor.

7. The electrical connector according to claim 1,
    wherein a part of the receiving hole gradually shrinks from upper to down, to form at least one supporting portion for supporting the first conductor; and
    wherein the supporting portion is an inclined surface.

8. The electrical connector according to claim 1, wherein the gallium or gallium alloy is melted under pressing or heating or under a combined action of the pressing and heating.

9. The electrical connector according to claim 1, further comprising an elastomer disposed between the first conductor and the first conducting portion or the second conducting portion.

10. The electrical connector according to claim 1, wherein the first conductor conducts at least one of the first conducting portion and the second conducting portion by gallium or gallium alloy.

11. The electrical connector according to claim 4, wherein content of tin in the tin-gallium alloy ball is greater than 65%.

12. The electrical connector according to claim 6, wherein the second conductor is a metal layer disposed on an inner wall of the receiving hole.

13. The electrical connector according to claim 6, wherein a liquid conductor conducts the first conductor and the second conductor.

14. The electrical connector according to claim 6, wherein the second conductor is provided with gallium or gallium alloy.

15. The electrical connector according to claim 9, wherein the elastomer is made of a foaming material, and the elastomer is provided with gallium or gallium alloy.

16. The electrical connector according to claim 14, wherein the gallium alloy of the second conductor is alloy of gallium and tin, and content of the tin is less than 65%.

* * * * *